(12) United States Patent
Barabash et al.

(10) Patent No.: US 8,975,134 B2
(45) Date of Patent: Mar. 10, 2015

(54) FULLERENE-BASED CAPACITOR ELECTRODE

(71) Applicant: Intermolecular, Inc., San Jose, CA (US)

(72) Inventors: Sergey Barabash, San Jose, CA (US); Dipankar Pramanik, Saratoga, CA (US); Xuena Zhang, San Jose, CA (US)

(73) Assignee: Intermolecular, Inc., San Jose, CA (US)

( * ) Notice: Subject to any disclaimer, the term of this patent is extended or adjusted under 35 U.S.C. 154(b) by 263 days.

(21) Appl. No.: 13/728,026

(22) Filed: Dec. 27, 2012

(65) Prior Publication Data

US 2014/0183664 A1 Jul. 3, 2014

(51) Int. Cl.
*H01L 21/8242* (2006.01)
*H01L 21/20* (2006.01)
*H01L 29/40* (2006.01)
*H01L 29/66* (2006.01)
*B82Y 10/00* (2011.01)
*H01L 29/49* (2006.01)
*H01L 29/94* (2006.01)

(52) U.S. Cl.
CPC ........ *H01L 29/401* (2013.01); *H01L 29/66181* (2013.01); *H01L 29/94* (2013.01); *B82Y 10/00* (2013.01); *H01L 29/49* (2013.01)
USPC ........... 438/240; 438/239; 438/381; 438/591; 257/E21.101; 257/E21.049; 257/E21.041; 257/E21.008; 257/E21.396

(58) Field of Classification Search
USPC .......... 438/239–240, 381, 591; 257/E21.008, 257/E21.041, E21.049, E21.101, E21.396
See application file for complete search history.

(56) References Cited

U.S. PATENT DOCUMENTS

| | | | |
|---|---|---|---|
| 5,383,088 A | 1/1995 | Chapple-Sokol et al. | |
| 6,812,399 B2 * | 11/2004 | Shaheen et al. | 136/263 |
| 7,129,003 B2 * | 10/2006 | Cagle | 429/231.8 |
| 7,335,569 B2 | 2/2008 | Senzaki | |
| 7,378,719 B2 | 5/2008 | Yang | |
| 7,948,738 B2 | 5/2011 | Shimamoto et al. | |

OTHER PUBLICATIONS

Yang et al.; Memristive switching mechanism for metal/oxide/metal nanodevices; Jun. 15, 2008; Macmillan Publishers Limited; Nature Nanotechnology, vol. 3; pp. 429-433.

Kim, S., et al.; Dielectric and Electrode Thin Films for Stack-Cell Structured DRAM Capacitors with Sub 50-nm Design Rules; Sep. 19, 2007; EMRS; Warsaw University of Technology; Dielectric Thin Film Lab, Seoul National University; 29 pages.

Seo, S., et al.; Electrode dependence of resistance switching in polycrystalline NiO films; Dec. 29, 2005; American Institute of Physics; Applied Physics Letters; pp. 263507-1-263507-3.

Lee, Se-Hee, et al.; Effect of Nonstoichiometry of Nickel Oxides on Their Supercapacitor Behavior; Aug. 30, 2004; Electrochemical and Solid-State Letters; The Electrochemical Society; pp. A299-A301.

(Continued)

*Primary Examiner* — Mohsen Ahmadi

(57) ABSTRACT

A doped fullerene-based conductive material can be used as an electrode, which can contact a dielectric such as a high k dielectric. By aligning the dielectric with the band gap of the doped fullerene-based electrode, e.g., the conduction band minimum of the dielectric falls into one of the band gaps of the doped fullerene-based material, thermionic leakage through the dielectric can be reduced, since the excited electrons or holes in the electrode would need higher thermal excitation energy to overcome the band gap before passing through the dielectric layer.

12 Claims, 7 Drawing Sheets

(56) References Cited

OTHER PUBLICATIONS

Watson et al.; Destruction of Superconductivity in the Narrow-band Metal K3C60; Feb. 1, 1997; Physical Review B, vol. 55, No. 6; The American Physical Society; pp. 3866-3869.

Xu et al.; Optical Properties of Superconducting K3C60 and Insulating K6C60; Dec. 15, 1991; Rapid Communications; Physical Review B, vol. 44, No. 23; The American Physical Society; pp. 13 171-13 174.

* cited by examiner

Forming a first layer on a substrate, wherein the first layer comprises a high k dielectric material
600

Forming a second layer in contact with the first layer, wherein the second layer is operable as an electrode, wherein the second layer comprises a doped fullerene-based material, wherein the doped fullerene-based material comprises a doping level, wherein the fullerene-based material comprises multiple conduction bands, wherein the doping level of the doped fullerene-based material is configured to align the conduction band minimum of the high k dielectric material with a band gap of the doped fullerene-based material
610

FIG. 6

Forming a first layer on a substrate,
wherein the first layer comprises a high k dielectric
material
700

Forming a second layer in contact with the first layer,
wherein the second layer is operable as an electrode,
wherein the second layer comprises a fullerene-based
material,
wherein the fullerene-based material comprises multiple
conduction bands
710

Doping the second layer to achieve a doping level,
wherein the doping level of the second layer is configured
to align the conduction band minimum of the first high k
dielectric material with a conduction band of the doped
fullerene-based material
720

FIG. 7

FULLERENE-BASED CAPACITOR ELECTRODE

TECHNICAL FIELD

Provided are methods of forming conducting materials, and more particularly methods of forming conducting materials having narrow conduction impurity band.

BACKGROUND

Requirements for gate dielectric thickness for advanced semiconductor devices can lead to significant tunneling. Thus high-dielectric constant (high k) materials, e.g., materials having a dielectric constant that is higher than that of the silicon dioxide, have been recently used. A challenge for the high k dielectric is to minimize the leakage current, e.g., to achieve a leakage current similar to that of silicon dioxide.

The leakage via dielectric layers can come from two main sources: tunneling of the electrons with energies in the range between the two Fermi energies of the two electrodes (the two Fermi energies having been separated by the finite voltage across the capacitor), and the propagation of thermionic excitations.

The electronic thermion excitations propagate easily (often nearly ballistically) if their energies exceed the electron Schottky barrier, approximately equal to the conduction band offset $b_{CBM}$ of the dielectric relative to the unbiased Fermi level. There also exist thermionic hole excitations that propagate if their energies are below the hole Schottky barrier, approximately equal to the valence band offset $b_{VBM}$ relative to the unbiased Fermi level. The thermionic currents are exponentially small in the value of the barriers $b_{CBM}$ and $b_{VBM}$, e.g., proportionally to $\exp(b_x/kT)$ with $b_x$ being $b_{CBM}$ or $b_{VBM}$. The values of $b_{CBM}$ and $b_{VBM}$ depend on material properties, such as the affinity and band gap of the dielectric material and the effective work function of the electrode, but typically $b_{CBM} < b_{VBM}$. Thus, electronic excitations are typically the main source of the thermionic leakage. The tunneling currents can have a different exponential dependence on the band gap value, such as, $$e^{d\sqrt{kb_{CBM}}}$$

or $$e^{d\sqrt{kb_{VBM}}}$$

in case of tunneling under flat-band conditions, where d is the material thickness and k is a numerical constant. Other mechanisms exhibiting more complex exponential dependence, e.g. those involving both tunneling and electron-phonon scattering (such as trap-assisted tunneling mechanism), can also contribute to leakage, for example in materials containing defects or impurities.

Reduction of tunneling leakage can be achieved by using a high-k material of increased equivalent thickness d, e.g., using materials having very high dielectric constant values. However, very high k strongly correlates with low value of the dielectric band gap, $b_{CBM}-b_{VBM}$. On the other hand, thermionic leakage becomes dominant if one or both barriers $b_{CBm}$ and $b_{VBm}$ are low, and/or the temperature T is high, and/or the dielectric thickness d is large. Thus, attempts to decrease tunneling often lead to an increase in thermionic leakage.

SUMMARY

In some embodiments, electrode materials are disclosed that can suppress a substantial part of the thermionic leakage. A doped fullerene-based conductive material can be used as an electrode, which can contact a dielectric such as a high k dielectric. The electronic band structure of the doped fullerene-based materials can include narrow bands corresponding to the ranges of allowed energies of thermal excitations, separated by (a) band gap(s) from other allowed thermionic states. By aligning the dielectric with (one of) the band gap(s) of the doped fullerene-based electrode (e.g., so that the conduction band minimum, or in some embodiments the valence band maximum, of the dielectric falls into one of the band gaps of the doped fullerene-based material), thermionic leakage through the dielectric can be reduced, since the excited electrons or holes in the electrode would need higher thermal excitation energy to overcome the band gap before passing through the dielectric layer.

In some embodiments, the doped fullerene-based materials include heavily hole doped or electron doped materials, such as potassium doped fullerene $K_3C_{60}$ for electron-doped electrode, or fluorine doped fullerene $F_xC_{60}$ for holed doped electrode.

In some embodiments, the level of doping is configured to provide a conductive fullerene-based material. For example, the doping level can provide higher than 0.5 or 0.7 charge carriers (holes or electrons) per carbon molecule, e.g., per $C_{60}$ molecule, or per $nm^2$ area. The doping level can be to move the Fermi level to within the band gap of the fullerene-based materials.

BRIEF DESCRIPTION OF THE DRAWINGS

To facilitate understanding, identical reference numerals have been used, where possible, to designate identical elements that are common to the figures. The drawings are not to scale and the relative dimensions of various elements in the drawings are depicted schematically and not necessarily to scale.

The techniques of the present invention can readily be understood by considering the following detailed description in conjunction with the accompanying drawings, in which:

FIG. 6 illustrates a process flowchart for forming a dielectric stack having low thermionic leakage current according to some embodiments.

FIG. 7 illustrates a process flowchart for forming a dielectric stack having low thermionic leakage current according to some embodiments.

DETAILED DESCRIPTION

A detailed description of one or more embodiments is provided below along with accompanying figures. The detailed description is provided in connection with such embodiments, but is not limited to any particular example. The scope is limited only by the claims and numerous alternatives, modifications, and equivalents are encompassed. Numerous specific details are set forth in the following description in order to provide a thorough understanding. These details are provided for the purpose of example and the described techniques may be practiced according to the claims without some or all of these specific details. For the purpose of clarity, technical material that is known in the technical fields related to the embodiments has not been described in detail to avoid unnecessarily obscuring the description.

High k materials, such as aluminum oxide or hafnium oxide, can reduce tunneling leakage by having high physical thickness while maintaining a low effective oxide thickness. High k value can strongly correlate with low value of the dielectric band gap, where thermionic leakage can become dominant.

In some embodiments, electrode materials and electrode/dielectric stacks are disclosed that can suppress a substantial part of the thermionic leakage. The electrodes can include a doped fullerene-based conductive material, which can contact a dielectric such as a high k dielectric. The band structure of the doped fullerene-based materials can include narrow thermal excitation bands, separated by (a) band gap(s) from other allowed thermionic states. By aligning the dielectric with (one of) the band gap(s) of the doped fullerene-based electrode (e.g., so that the conduction band minimum of the dielectric falls into one of the band gaps of the doped fullerene-based material), thermionic leakage through the dielectric can be reduced, since the excited electrons or holes in the electrode would need higher thermal excitation energy to overcome the band gap before passing through the dielectric layer.

In some embodiments, the alignment process can be performed by adjusting a doping level of the doped fullerene-based conductive material, which can result in changing the Fermi energy level, leading to the movement of the band structure of the electrode relative to the band structure of the dielectric.

Figure 1A:
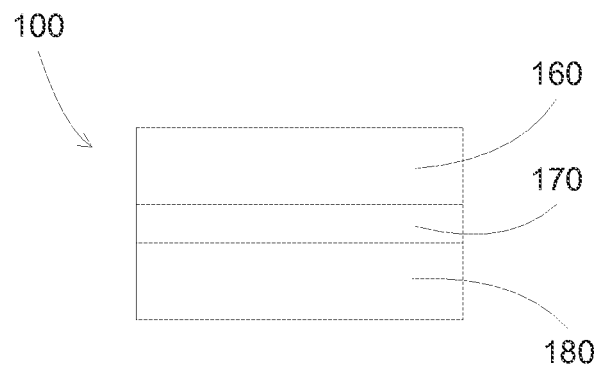
FIGS. 1A-1B illustrate configurations of electrode and dielectric according to some embodiments.
Figure 1B:
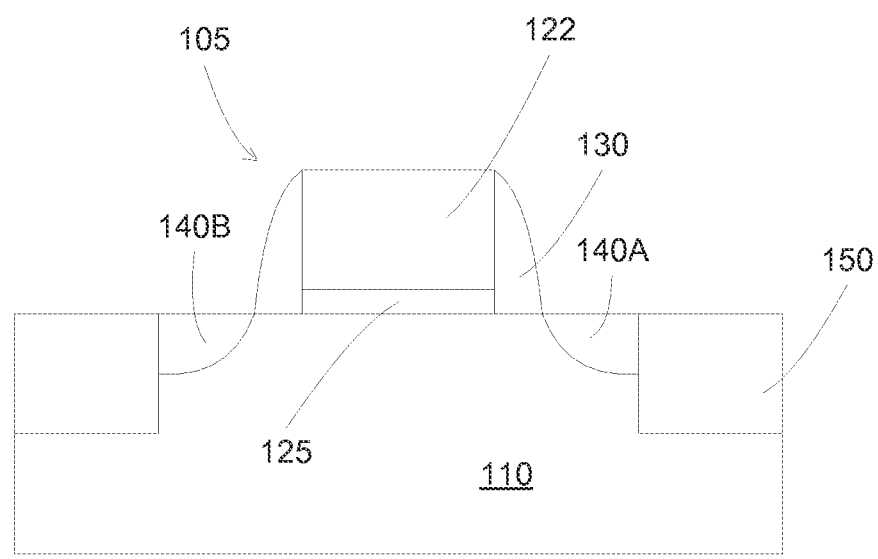

FIGS. 1A-1B illustrate configurations of electrode and dielectric according to some embodiments. In FIG. 1A, a capacitor structure 100 can include a dielectric layer 170, such as a high k dielectric layer, sandwiched between electrodes 160 and 180. When a voltage is applied to the electrodes, an electric field can be established across the dielectric layer 170. Thermionic leakage current can be present as the result of the electric field, due to the excitation of charges in the electrodes. The thermionic leakage can affect the operation of the capacitor device.

In FIG. 1B, a transistor structure 105 can be formed on a substrate 110, including isolation regions 150 to isolate the neighboring devices, source and drain regions 140A and 140B sandwiching a gate electrode 120 including a gate dielectric 125 and a gate conductor 122. Spacers 130 cover the sidewalls of the gate electrode 120. The substrate 110 can be a semiconductor substrate, or any substrates having a layer of semiconductor material. For example, the substrate 110 can be a single crystal silicon substrate. The substrate 110 can be a silicon-germanium substrate, or can have a silicon germanium layer disposed on top. The gate conductor 122 can include doped polysilicon or metal. When a voltage is applied to the gate conductor 122, an electric field can be established across the gate dielectric 125, changing the distribution of charges in the substrate 110. Thermionic leakage current can be present as the result of the electric field, due to the excitation of charges in the gate conductor. The thermionic leakage can affect the operation of the transistor. FIG. 1B shows an example of a metal-oxide-semiconductor field effect transistor (MOSFET) structure 100, but the invention is not so limited, and can include any transistor structure, such as bipolar transistors, fin transistors or double gate transistors. In addition, support structures and devices can also be included, such as silicidation.

Figure 2A:
FIGS. 2A-2B illustrate a stack of electrode and dielectric according to some embodiments.
Figure 2B:
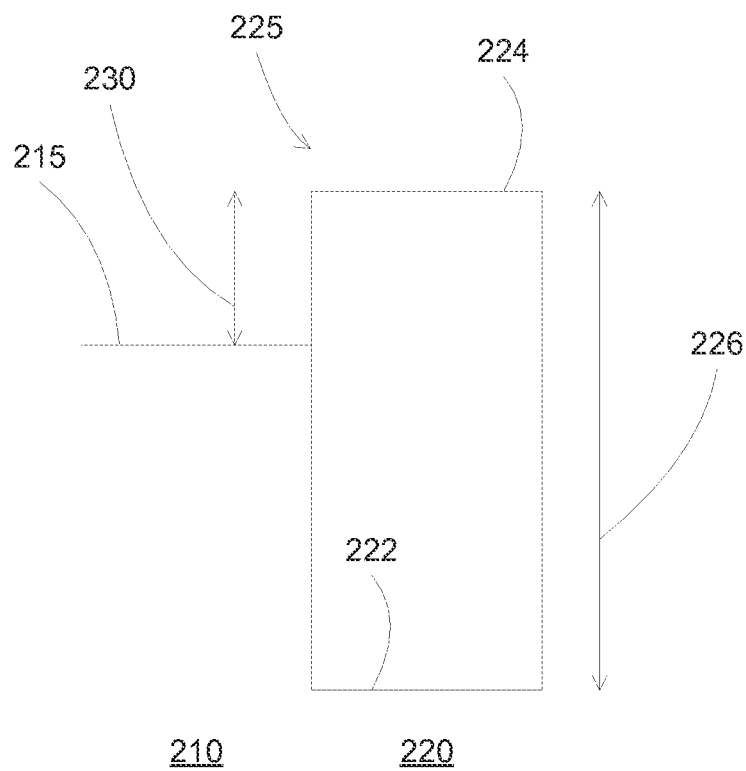

FIGS. 2A-2B illustrate a stack of electrode and dielectric according to some embodiments. In FIG. 2A, a conductive material 210, which can operate as an electrode, can be formed on a dielectric material 220, which can operate as a dielectric layer. In FIG. 2B, a band diagram of the electrode/dielectric stack can be shown. The electrode 210 can be represented by a Fermi level $E_F$ 215. The dielectric 220 can be represented by a band gap 225, including a conduction band minimum $E_{CBM}$ 224 and a valence band maximum $E_{VBM}$ 222. The separation 226 between the conduction band minimum 224 and the valence band maximum 222 can represent the energy value of band gap of the dielectric 220.

Electrons from the electrode 210 can receive excitation energy, e.g., thermionic energy, to overcome the barrier height 230 and become thermionic leakage current. Thus for a typical configuration of a conductive electrode, such as a metal, in contact with a dielectric, an excitation greater than the difference between the conduction band minimum 224 and the Fermi level 215, e.g., $\Delta E = E_{CBM} - E_F$, can let the electrons surpassing the barrier height 230 and creating a leakage current. There is also a contribution to the thermionic leakage current from thermally excited holes that need to overcome a hole excitation barrier $\Delta E' = -(E_{VBM} - E_F)$ between the Fermi level 215 and the valence band minimum 222 in order to create a leakage current. One having ordinary skills in the art would understand that vertically flipping a band alignment diagram with respect to the Fermi level, one would interchange the characteristics related to the electron and the hole contributions (such as the electron and hole excitation barriers, $\Delta E$ and $\Delta E'$). The subsequent discussion uses the example of thermionic leakage from thermally excited electrons, however, all the cases of thermionic leakage from thermally excited electrons related by the aforementioned symmetry are encompased. The scope is limited only by the claims.

In some embodiments, doped fullerene-based electrodes are disclosed, which can reduce the thermionic leakage across the dielectric. A band gap of doped fullerene-based electrodes can align with the conduction band minimum of the dielectric so that the electrons would require an excitation greater than $\Delta E$, e.g., greater than $E_{CBM} - E_F$, before overcoming the barrier height.

Figure 3A:
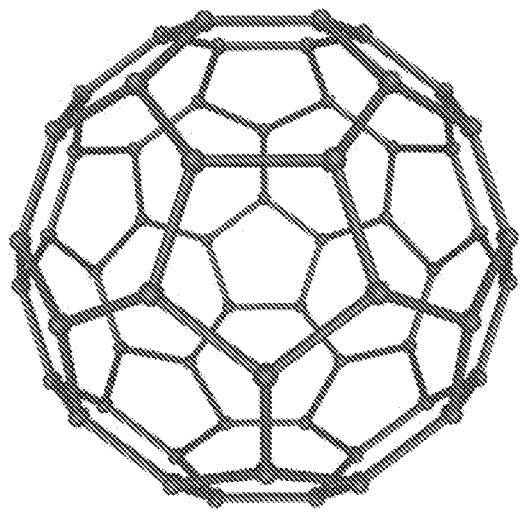
FIGS. 3A-3D illustrate fullerene structure and band diagram according to some embodiments.
Figure 3B:
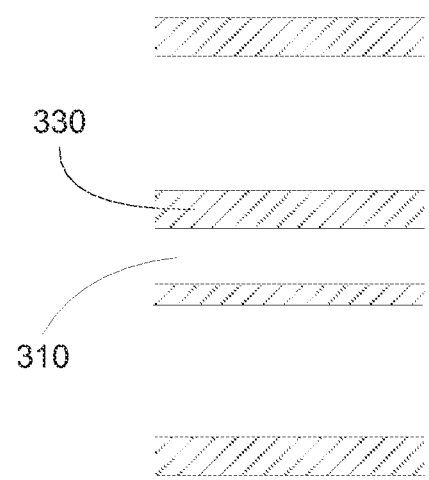
Figure 3C:
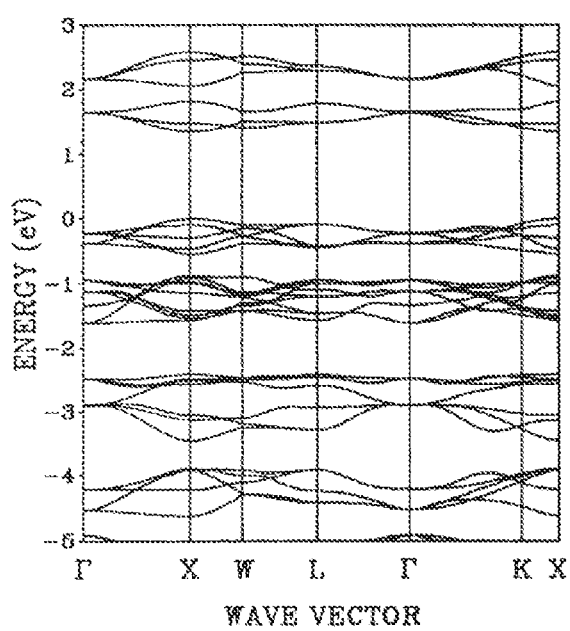
Figure 3D:
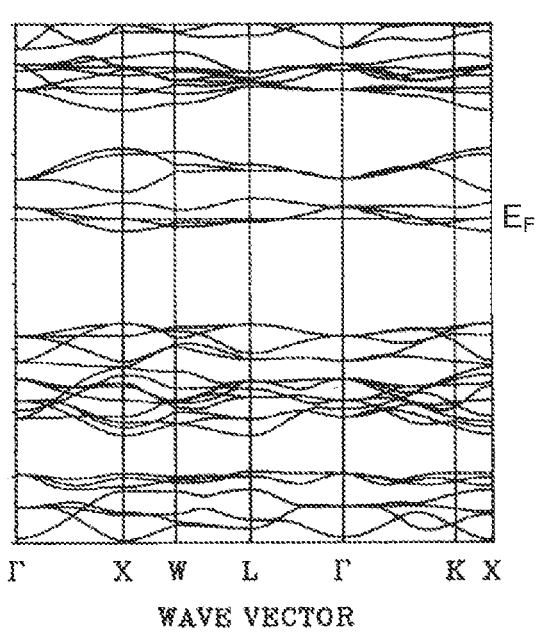

FIGS. 3A-3D illustrate fullerene structure and band diagram according to some embodiments. A fullerene can be a carbon molecule, in the form of a hollow sphere, ellipsoid or tube. For example, spherical fullerenes can resemble soccer balls. Cylindrical fullerenes are typically called carbon nanotubes. In FIG. 3A, a $C_{60}$ fullerene structure is shown, including 60 carbon atoms arranged in a hollow sphere configuration. In some embodiments, a fullerene can be a molecule of another element or of two elements (e.g. of boron and nitride, BN, or of zinc and oxygen, ZnO) that exhibits atomic geometry and bonding pattern similar to those in carbon fullerenes. In FIG. 3B, a schematic of the energy band diagram of C60 fullerene is shown, including multiple conduction bands 320 separated by multiple band gaps 310. The band diagram of fullerenes can be changed, such as changing the shape and the relative energy of the conduction bands with respect to each other and/or the Fermi level and/or the vacuum energy level. For example, FIG. 3C shows a band diagram of undoped $C_{60}$ fullerene, and FIG. 3D shows a band diagram of potassium doped $K_3C_{60}$ fullerenes (Xu et al., Phys Rev B 44, 13171 (1991)). The band diagrams can be calculated from first principles using, for example, orthogonalized linear combination of atomic orbitals method in the local density approximation (LDA), for example, as shown in Xu et al., Phys Rev B 44, 13171 (1991). $C_{60}$ fullerene is an insulator, and $K_3C_{60}$ fullerene is a conductor, shown with Fermi level $E_F$ at zero energy. By doping fullerenes, the band energy can be shifted, e.g., so that Fermi energy $E_F$ can cross one of the conduction bands.

In the fullerenes, the electronic excitations can be allowed within narrow (~0.5 eV wide) conduction bands, that can be separated by a small gap from each other and by a much larger gap from other allowed thermionic states.

Depending on a convention, the bands that are unoccupied in an undoped fullerene at low temperature (i.e. the bands that have energy higher than the Fermi energy) can be called conduction bands, and those that are fully occupied in an undoped fullerene at low temperature (i.e. the bands that have energy lower than the Fermi energy) can be called valence bands. On the other hand, in the doped case, any partially occupied band can be called a "conduction band".

In some embodiments, the doped fullerene-based materials can include heavily electron doped or hole doped materials, such as potassium doped fullerene $K_3C_{60}$ for electron-doped electrode, or fluorine doped fullerene $F_xC_{60}$ for holed doped electrode. The level of doping is configured to provide a conductive fullerene-based material, together with band gap matching with the dielectric material, and to allow an adequate charge storage without or with only moderate depletion of the fullerene-based material. For example, the doping level can provide higher than 0.5 or higher than 0.7 charges (holes or electrons) per fullerene molecule, e.g., per 60 carbon atoms for $C_{60}$ molecule, or per $nm^2$ area of a substantially a monolayer of fullerenes. The doping level can be configured to move the Fermi level so that the conduction band maximum of the dielectric is within a band gap (among the multiple band gaps) of the fullerene-based materials. The thickness of the doped fullerene-based electrode can be larger than 2 nm, such as between 2 and 20 nm, or between 5 and 10 nm. The dielectric can include titanium oxide, e.g., $TiO_2$, or another dielectric or a substantially undoped wide-band gap (more than 2 eV) semiconductor material as long as it can be configured to have a conduction band minimum aligned with the Fermi level of the doped fullerene material (e.g. by appropriate doping of the fullerene material). The thickness of the dielectric can be larger than 2 nm, such as between 2 and 20 nm, or between 5 and 10 nm.

In some embodiments, additional conductive material with high conductivity can be used together with the doped fullerene-based material to improve the conduction of the electrode.

Figure 4A:
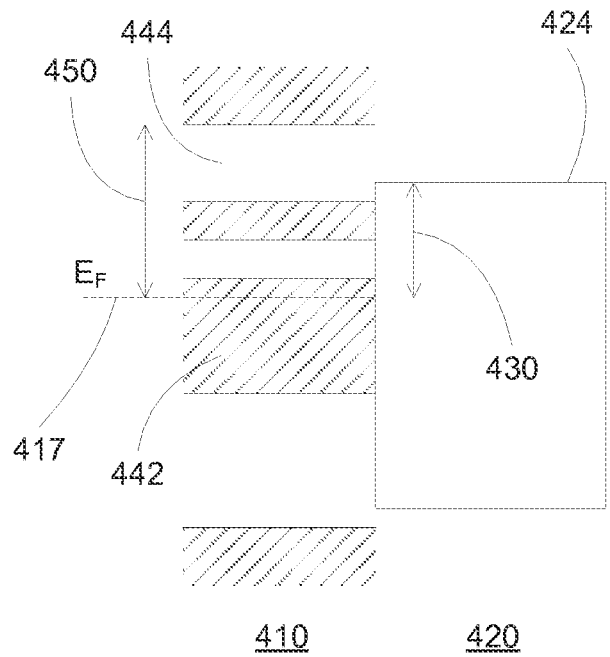
FIGS. 4A-4B illustrate electron doped fullerene electrodes according to some embodiments.
Figure 4B:
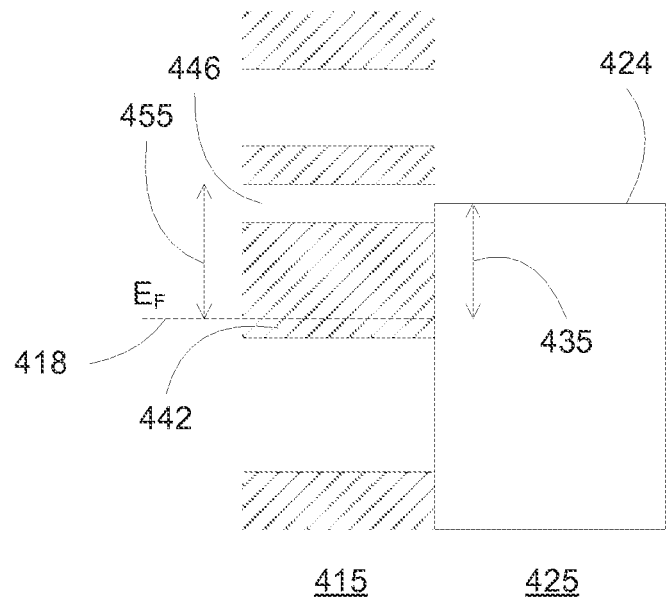

FIGS. 4A-4B illustrate electron doped fullerene electrodes according to some embodiments. Fullerene materials can have multiple conduction bands with each pair of adjacent conduction bands separated by a band gap. By doping the fullerene, e.g., with potassium to generate electron charges, the Fermi level can be adjusted between the conduction bands.

In FIG. 4A, the fullerene 410 can be doped to bring the Fermi level 415 to the top of a conduction band 442 of the fullerene. The doping level can be adjusted so that the conduction band maximum 424 of the dielectric 420 band gap is within a band gap 444 of the fullerene. Since the band gap 444 is forbidden, the electrons in the conduction band 442 will need at least an excitation energy 450 to pass through the dielectric 420. This excitation energy 450 is greater than the difference 430 between the conduction band minimum 424 and the Fermi level 417, e.g., $\Delta E = E_{CBM} - E_F$, which is the required excitation energy for conventional conductive materials such as metals. Thus the thermionic leakage through the dielectric 420 can be reduced, due to the requirement of higher excitation energy. The leakage can be significantly reduced, since the leakage current is exponentially proportional to the excitation energy.

FIG. 4B shows a different alignment configuration for the doped fullerene 415 and the dielectric 425. The fullerene 415 can be doped to bring the Fermi level 415 to the bottom of the conduction band 442 of the fullerene. The doping level can be adjusted so that the conduction band maximum 424 of the dielectric 425 band gap is within a band gap 446 of the fullerene, different from the band gap 444 as discussed above. Since the band gap 446 is forbidden, the electrons in the conduction band 442 will need at least an excitation energy 455 to pass through the dielectric 425. This excitation energy 455 is greater than the difference 435 between the conduction band minimum 424 and the Fermi level 418, e.g., $\Delta E = E_{CBM} - E_F$, which is the required excitation energy for conventional conductive materials such as metals. Thus the thermionic leakage through the dielectric 425 can be reduced, due to the requirement of higher excitation energy. The leakage can be significantly reduced, since the leakage current is exponentially proportional to the excitation energy.

In some embodiments, the doped fullerene can have multiple band gaps with different band gap widths. The conduction band minimum of the dielectric band gap can be aligned with the larger or smaller of the band gap of the doped fullerene electrode, and the Fermi level of the fullerene can be positioned in any of the fullerene bands.

Figure 5:
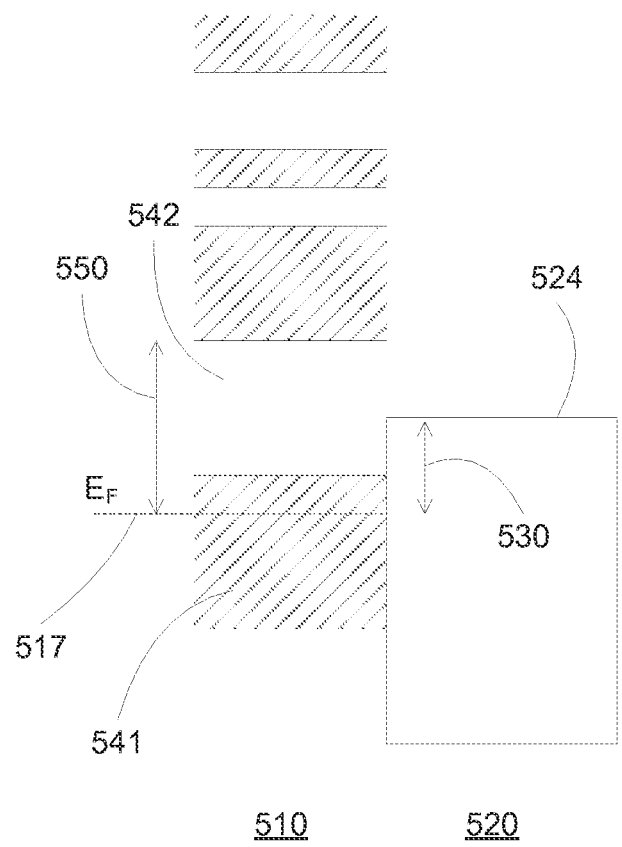
FIG. 5 illustrates a hole doped fullerene electrode according to some embodiments.

FIG. 5 illustrates a hole doped fullerene electrode according to some embodiments. Fullerene materials can have multiple conduction bands with each pair of adjacent conduction bands separated by a band gap. In some embodiments, by doping the fullerene, e.g., with fluorine to generate hole charges, the Fermi level can be adjusted between different conduction bands, possibly including the bands that can be called a valence band in the undoped fullerene.

The fullerene 510 can be doped to bring the Fermi level 515 to the top of a conduction band 541 of the fullerene. The doping level can be adjusted so that the conduction band maximum 524 of the dielectric 520 band gap is within a band gap 542 of the fullerene. Since the band gap 542 is forbidden, the holes in the conduction band 541 will need at least an excitation energy 550 to pass through the dielectric 520. This excitation energy 550 is greater than the difference 530 between the conduction band minimum 524 and the Fermi level 517, e.g., $\Delta E = E_{CBM} - E_F$, which is the required excitation energy for conventional conductive materials such as metals. Thus the thermionic leakage through the dielectric 520 can be reduced, due to the requirement of higher excitation energy. The leakage can be significantly reduced, since the leakage current is exponentially proportional to the excitation energy.

In some embodiments, methods to form dielectric stacks having low thermionic leakage current are disclosed. The methods can include using doped fullerene as the electrode adjacent to the dielectric. The doping level of the doped fullerene can be adjusted so that the conduction band maximum of the dielectric is within a band gap of the doped fullerene.

FIG. 6 illustrates a process flowchart for forming a dielectric stack having low thermionic leakage current according to some embodiments. In operation 600, a dielectric layer is formed on a substrate. The dielectric layer can be formed by a deposition process, such as an atomic layer deposition (ALD) process, a physical vapor deposition (PVD) process, a chemical vapor deposition (CVD) process, or any other processes. Treatments can be performed on the deposited dielectric layer, including an anneal process. The dielectric layer can include high dielectric constant material, such as titanium dioxide, or a substantially undoped wide-band gap (more than 2 eV) semiconductor.

In operation 610, a doped fullerene layer is formed in contact with the dielectric layer. The doped fullerene-based material can include a doping level so that the conduction band minimum of the dielectric material is aligned with a band gap of the doped fullerene-based material. The dopant can include potassium or fluorine, or other mono-atomic or poly-atomic dopants. The doping level can be greater than 0.5 or 0.7 dopants per fullerene molecules.

In some embodiments, a conductive layer can be formed on the doped fullerene layer. The conductive layer can be operable to increase the conductivity of the electrode. In some embodiments, the doped fullerene layer can be formed on the dielectric layer. Alternatively, the dielectric layer can be formed on the doped fullerene layer. Further, two doped fullerene layers can be formed, sandwiching the dielectric layer, and neither, or one, or both doped fullerene layers can contact one or more conductive layers that can be operable to increase the conductivity of the respective fullerene electrode.

FIG. 7 illustrates a process flowchart for forming a dielectric stack having low thermionic leakage current according to some embodiments. In operation 700, a dielectric layer is formed on a substrate. The dielectric layer can be formed by a deposition process, such as an atomic layer deposition (ALD) process, a physical vapor deposition (PVD) process, a chemical vapor deposition (CVD) process, or any other processes. Treatments can be performed on the deposited dielectric layer, including an anneal process. The dielectric layer can include high dielectric constant material, such as titanium dioxide.

In operation 710, a fullerene layer is formed in contact with the dielectric layer. In operation 720, the fullerene layer is doped with a dopant to achieve a doping level. The doping level can be configured so that the conduction band minimum of the dielectric material is aligned with a band gap of the doped fullerene-based material. The dopant can include potassium or fluorine. The doping level can be greater than 0.5 or 0.7 dopants per fullerene molecules.

In some embodiments, a conductive layer can be formed on the doped fullerene layer. The conductive layer can be operable to increase the conductivity of the electrode. In some embodiments, the doped fullerene layer can be formed on the dielectric layer. Alternatively, the dielectric layer can be formed on the doped fullerene layer. Further, two doped fullerene layers can be formed, sandwiching the dielectric layer.

In some embodiments, methods are provided to form fullerene electrodes. The methods can include forming a first layer on a substrate, wherein the first layer can include forming a high k dielectric material; forming a second layer in contact with the first layer, wherein the second layer is operable as an electrode, wherein the second layer can include a doped fullerene-based material, wherein the doped fullerene-based material can include a doping level, wherein the fullerene-based material can include multiple conduction bands, wherein the doping level of the doped fullerene-based material is configured to position the Fermi level inside one of the conduction bands and to align the valence band maximum of the high k dielectric material with a band gap of the doped fullerene-based material.

In some embodiments, the high k material can include $TiO_2$. The fullerene-based material can include $C_{60}$ or $C_{40}$. The doped fullerene-based material can include $K_3C_{60}$. The doping level of the doped fullerene-based material can include higher than 0.7 dopants per fullerene molecule. The conduction band minimum of the high k dielectric material can be aligned with one of the gaps between substantially conduction bands of the doped fullerene-based material. The conduction band minimum of the high k dielectric material can be aligned with the band gap between substantially a conduction and valence bands of the doped fullerene-based material. The doped fullerene-based material can be doped with potassium. The doped fullerene-based material can be doped with fluorine.

In some embodiments, the methods can include forming a first layer on a substrate, wherein the first layer can include a high k dielectric material; forming a second layer in contact with the first layer, wherein the second layer is operable as an electrode, wherein the second layer can include a fullerene-based material, wherein the fullerene-based material can include multiple conduction bands, doping the second layer to achieve a doping level, wherein the doping level of the second layer is configured to align the valence band maximum of the high k dielectric material with a band gap of the doped fullerene-based material.

In some embodiments, the high k material can include $TiO_2$. The doped fullerene-based material can include $K_3C_{60}$. The doping level of the doped fullerene-based material can include higher than 0.7 dopants per fullerene molecule. The conduction band minimum of the high k dielectric material can be aligned with one of the gaps between substantially conduction bands of the doped fullerene-based material. The conduction band minimum of the high k dielectric material can be aligned with a band gap between substantially a conduction and valence bands of the doped fullerene-based material. The doped fullerene-based material can be doped with potassium. The doped fullerene-based material can be doped with fluorine.

In some embodiments, devices are provided having fullerene electrodes. The device can include a first layer disposed on a substrate, wherein the first layer can include a high k dielectric material; a second layer in contact with the first layer, wherein the second layer is operable as an electrode, wherein the second layer can include a doped fullerene-based material, wherein the fullerene-based material can include multiple conduction bands, wherein the doping level of the second layer is configured to align the valence band maximum of the high k dielectric material with a band gap of the doped fullerene-based material.

In some embodiments, the high k material can include $TiO_2$. The doped fullerene-based material can include $K_3C_{60}$. The doping level of the doped fullerene-based material can include higher than 0.7 dopants per fullerene molecule. The doped fullerene-based material can be doped with potassium. The doped fullerene-based material can be doped with fluorine.

In some embodiments, the device can include a first layer disposed on a substrate, wherein the first layer is operable as an electrode, wherein the first layer can include a doped fullerene-based material, wherein the fullerene-based material has multiple conduction bands, wherein the doping level of the first layer is configured to align the band gap of the first layer with the conduction band minimum of a high k dielectric material that may be deposited on top of the first layer; a second layer in contact with the first layer, wherein the second layer can include a high k dielectric material.

In some embodiments, the high k material can include $TiO_2$. The doped fullerene-based material can include $K_3C_{60}$. The doping level of the doped fullerene-based material has higher than 0.7 dopants per fullerene molecule. The doped fullerene-based material can be doped with potassium. The doped fullerene-based material can be doped with fluorine.

In some embodiments, the device can include a first layer disposed on a substrate, wherein the first layer is operable as an electrode, wherein the first layer can include a doped fullerene-based material, wherein the fullerene-based material has multiple conduction bands, wherein the doping level of the first layer is configured to align the band gap of the first layer with the valence band maximum of a high k dielectric material that may be deposited on top of the first layer; a second layer in contact with the first layer, wherein the second layer can include a high k dielectric material.

In some embodiments, the high k material can include $TiO_2$. The doped fullerene-based material can include $K_3C_{60}$. The doping level of the doped fullerene-based material has higher than 0.7 dopants per fullerene molecule. The doped fullerene-based material can be doped with potassium. The doped fullerene-based material can be doped with fluorine.

Although the foregoing examples have been described in some detail for purposes of clarity of understanding, the invention is not limited to the details provided. There are many alternative ways of implementing the invention. The disclosed examples are illustrative and not restrictive.

What is claimed is:

1. A method comprising:
    forming a first layer on a substrate,
        wherein the first layer comprises a high k dielectric material,
        wherein the first layer has a first conduction band and a first valence band and a first band gap between the first conduction band and the first valence band,
        wherein the first conduction band has a conduction band minimum energy level;
    forming a second layer in contact with the first layer,
        wherein the second layer is operable as an electrode,
        wherein the second layer comprises a doped fullerene-based material,
        wherein the doped fullerene-based material comprises a plurality of second conduction bands,
        wherein the doped fullerene-based material is configured to position the first conduction band minimum energy level within a band gap of two adjacent second conduction bands of the plurality of second conduction bands,
    wherein the high K material comprises $TiO_2$.

2. A method as in claim 1 wherein the fullerene-based material comprises $C_{60}$ or $C_{40}$.

3. A method as in claim 1 wherein the doped fullerene-based material comprises $K_3C_{60}$.

4. A method as in claim 1
    wherein the doping level of the doped fullerene-based material comprises higher than 0.7 dopants per fullerene molecule.

5. A method as in claim 1 wherein the doped fullerene-based material is doped with potassium.

6. A method as in claim 1 wherein the doped fullerene-based material is doped with fluorine.

7. A method comprising:
    forming a first layer on a substrate,
        wherein the first layer comprises a high k dielectric material,
        wherein the first layer has a first conduction band and a first valence band and a first band gap between the first conduction band and the first valence band,
        wherein the first conduction band has a conduction band minimum energy level;
    forming a second layer in contact with the first layer,
        wherein the second layer is operable as an electrode,
        wherein the second layer comprises a doped fullerene-based material,
        wherein the doped fullerene-based material comprises a plurality of second conduction bands,
    doping the second layer to achieve a doping level,
        Wherein the doping level of the second layer is configured to position the first conduction band minimum energy level within a band gap of two adjacent second conduction bands of the plurality of second conduction bands,
    wherein the high K material comprises $TiO_2$.

8. A method as in claim 7 wherein the fullerene-based material comprises $C_{60}$ or $C_{40}$.

9. A method as in claim 7 wherein the doped fullerene-based material comprises $K_3C_{60}$.

10. A method as in claim 7
    wherein the doping level of the doped fullerene-based material comprises higher than 0.7 dopants per fullerene molecule.

11. A method as in claim 7
    wherein the doped fullerene-based material is doped with potassium.

12. A method as in claim 7
    wherein the doped fullerene-based material is doped with fluorine.

* * * * *